United States Patent
Barabash et al.

(10) Patent No.: US 8,766,404 B1
(45) Date of Patent: Jul. 1, 2014

(54) DEVICE DESIGN FOR PARTIALLY ORIENTED RUTILE DIELECTRICS

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/738,127

(22) Filed: Jan. 10, 2013

(51) Int. Cl.
*H01L 21/02* (2006.01)
*H01L 21/20* (2006.01)
*H01L 29/66* (2006.01)
*H01L 29/94* (2006.01)
*H01L 49/02* (2006.01)

(52) U.S. Cl.
CPC ........ *H01L 29/66181* (2013.01); *H01L 29/945* (2013.01); *H01L 28/40* (2013.01); *H01L 28/65* (2013.01)
USPC ............ 257/534; 257/E29.342; 257/E21.006; 438/381

(58) Field of Classification Search
CPC ......... H01L 21/00; H01L 27/00; H01L 28/00; H01L 29/00
USPC .................. 257/532, 534, E29.342, E21.008; 438/381

See application file for complete search history.

(56) References Cited

U.S. PATENT DOCUMENTS

| | | | | |
|---|---|---|---|---|
| 5,561,308 | A * | 10/1996 | Kamata et al. | 257/301 |
| 8,227,847 | B2 * | 7/2012 | Neuilly et al. | 257/301 |
| 2002/0022317 | A1 * | 2/2002 | Fukuzumi | 438/253 |
| 2005/0140010 | A1 * | 6/2005 | Ning | 257/758 |
| 2007/0045693 | A1 * | 3/2007 | Manning et al. | 257/296 |
| 2009/0065896 | A1 * | 3/2009 | Hwang | 257/532 |
| 2009/0256182 | A1 * | 10/2009 | Sukekawa | 257/296 |
| 2011/0001217 | A1 * | 1/2011 | Neuilly et al. | 257/532 |
| 2012/0049320 | A1 * | 3/2012 | Parsey et al. | 257/528 |
| 2012/0199944 | A1 * | 8/2012 | Huang et al. | 257/532 |

* cited by examiner

*Primary Examiner* — Chuong A Luu
*Assistant Examiner* — Moazzam Hossain

(57) ABSTRACT

Methods include forming a dielectric layer from a first material above a substrate. The dielectric layer is formed such that a preferred crystal direction for at least one electrical property of the first material is parallel to a surface of the dielectric layer. Next, forming a first and second trench within the dielectric layer wherein the first and second trenches have at least one curved portion. Forming a second material within the first trench and a third material within the second trench wherein the first material is different from the second and third materials. The first and second trenches are separated by a distance between 3-20 nm.

16 Claims, 12 Drawing Sheets

DEVICE DESIGN FOR PARTIALLY ORIENTED RUTILE DIELECTRICS

FIELD

The present disclosure relates to methods of increasing the effective dielectric constant of dielectric films within semiconductor-based capacitive devices.

BACKGROUND

Many electronic devices such as dynamic random access memory (DRAM) cells and transistor gates include charge storage capacitors coupled to an access device, such as a Metal-Oxide-Semiconductor Field Effect Transistor (MOSFET). In particular, a MOSFET can apply or remove electric charge on a capacitor thus affecting a logical state defined by the stored charge. Many electronic devices require materials with high dielectric constant ("k") values (or dielectric tensor values) to effectively store electric charge.

The dielectric constant value of a material may be defined as the ratio of its absolute permittivity tensor, $\epsilon$, to the permittivity of vacuum, $\epsilon_o$, (i.e., $k=\epsilon/\epsilon_o$). The dielectric constant is unitless because it is a ratio of two similar quantities.

Conventional capacitors include two conductors, such as parallel metal or polysilicon plates, which function as electrodes. These electrodes are insulated from each other by an interposed dielectric material. For example, one type of capacitor used in DRAM cells is a metal-insulator-metal (MIM) capacitor.

Materials having a rutile crystal structure, such as the rutile polymorph of titanium dioxide ($TiO_2$), have been used as dielectric materials for high-κ dielectric applications. $TiO_2$-based dielectric materials have the potential to exhibit relatively high dielectric constant values. However, the effective dielectric constant, $k_{eff}$, typically remains below 100.0 (e.g., 80-90) due to conventional semiconductor manufacturing sequence(s).

Particularly, high dielectric constant values have been discovered for $TiO_2$ single crystals when measured along a tetragonal axis (i.e. along the [001] crystal direction). For example, some single crystal rutile $TiO_2$ materials have been found to exhibit dielectric constant values of 86 ($\kappa_\perp$) and 170 ($\kappa_\parallel$).

As such, the effective dielectric constant values exhibited in semiconductor-based capacitive devices suggest that for a typical modern semiconductor manufacturing sequence, the materials crystallize in a manner such that the effective dielectric constant is reflected by the lower dielectric constant $\kappa_\perp$ value. Most notably, the lower dielectric constant $\kappa_\perp$ values are typical for conventional thin film deposition techniques utilized to deposit the dielectric film parallel to the electrode(s) within the trenches. Because the dielectric film is likely grown with a (110) free surface, thus having the high-k [001] direction in-plane, the direction normal to the electrodes will be the low-k direction, thereby leading to dielectric constant values of 86 (or lower due to structural defects) in case of $TiO_2$.

At best, a polycrystalline film having a rutile crystal structure having randomly oriented crystallites may be utilized. In this scenario, the effective dielectric constant value, $\kappa_{eff}$, is an average of $\kappa_\perp$ and $\kappa_\parallel$ with a twice larger weight given to the smaller dielectric constant $\kappa_\perp$ value.

As such, what is needed is a method to increase the effective dielectric constant values of dielectric materials within semiconductor-based capacitive devices. The present disclosure addresses such a need.

SUMMARY OF THE DISCLOSURE

The following summary is included in order to provide a basic understanding of some aspects and features of the present disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

Methods include forming a dielectric layer from a first material above a substrate. The dielectric layer is formed such that a preferred crystal direction for at least one electrical property of the first material is parallel to a surface of the dielectric layer. Next, forming a first and second trench within the dielectric layer wherein the first and second trenches have at least one curved portion. Forming a second material within the first trench and a third material within the second trench wherein the first material is different from the second and third materials. The first and second trenches are separated by a distance between 3-20 nm.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale. The techniques of the present disclosure may readily be understood by considering the following detailed description in conjunction with the accompanying drawings, in which.

DETAILED DESCRIPTION

Figure 1:
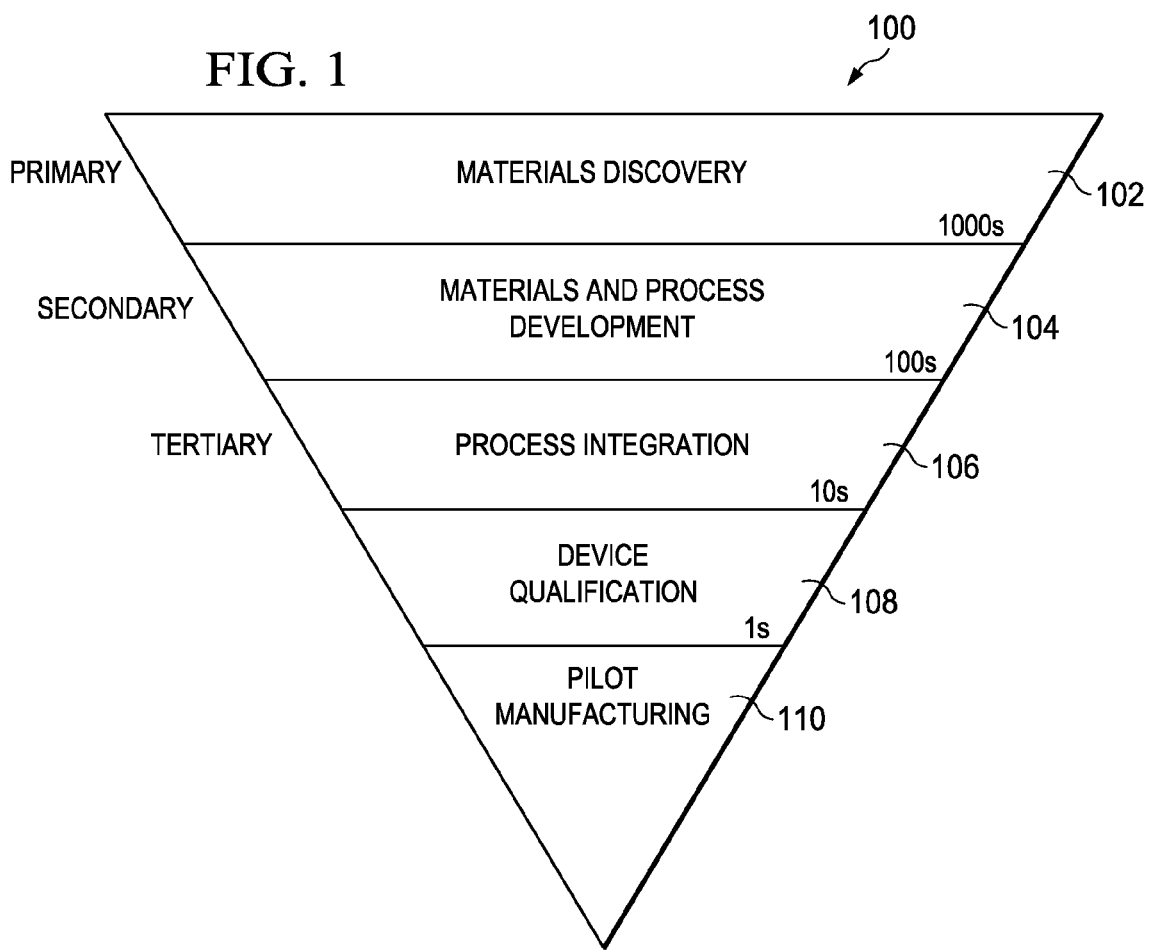
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Methods include forming a dielectric layer from a first material above a substrate. The dielectric layer is formed such that a preferred crystal direction for at least one electrical property of the first material is parallel to a surface of the dielectric layer. Next, forming a first and second trench within the dielectric layer wherein the first and second trenches have at least one curved portion. Forming a second material within the first trench and a third material within the second trench wherein the first material is different from the second and third materials. The first and second trenches are separated by a distance between 3-20 nm.

It is to be understood that unless otherwise indicated this disclosure is not limited to specific layer compositions or surface treatments. It is also to be understood that the terminology used herein is for the purpose of describing particular embodiments only and is not intended to limit the scope of the present disclosure.

It must be noted that as used herein and in the claims, the singular forms "a," and "the" include plural referents unless the context clearly dictates otherwise. Thus, for example, reference to "a layer" also includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region may include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area on a substrate, e.g., blanket substrate which is defined through the processing.

The term "substrate" as used herein may refer to any workpiece on which formation or treatment of material layers is desired. Substrates may include, without limitation, silicon, coated silicon, other semiconductor materials, glass, polymers, metal foils, etc. The term "substrate" or "wafer" may be used interchangeably herein. Semiconductor wafer shapes and sizes may vary and include commonly used round wafers of 2", 4", 200 mm, or 300 mm in diameter.

It is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This may greatly improve both the speed and reduce the costs associated with the discovery, implementation, optimization, and qualification of material(s), process(es), and process integration sequence(s) required for manufacturing.

Systems and methods for HPC™ processing are described in U.S. Pat. No. 7,544,574 filed on Feb. 10, 2006; U.S. Pat. No. 7,824,935 filed on Jul. 2, 2008; U.S. Pat. No. 7,871,928 filed on May 4, 2009; U.S. Pat. No. 7,902,063 filed on Feb. 10, 2006; and U.S. Pat. No. 7,947,531 filed on Aug. 28, 2009 which are all herein incorporated by reference for all purposes. Systems and methods for HPC™ processing are further described in U.S. patent application Ser. No. 11/352,077 filed on Feb. 10, 2006, claiming priority from Oct. 15, 2005; U.S. patent application Ser. No. 11/419,174 filed on May 18, 2006, claiming priority from Oct. 15, 2005; U.S. patent application Ser. No. 11/674,132 filed on Feb. 12, 2007, claiming priority from Oct. 15, 2005; and U.S. patent application Ser. No. 11/674,137 filed on Feb. 12, 2007, claiming priority from Oct. 15, 2005 which are all herein incorporated by reference for all purposes.

HPC™ processing techniques have been successfully adapted to wet chemical processing such as etching, texturing, polishing, cleaning, etc. HPC™ processing techniques have also been successfully adapted to deposition processes such as physical vapor deposition (PVD) (i.e. sputtering), atomic layer deposition (ALD), and chemical vapor deposition (CVD).

In addition, systems and methods for combinatorial processing are further described in U.S. patent application Ser. No. 13/341,993 filed on Dec. 31, 2011 and U.S. patent application Ser. No. 13/302,730 filed on Nov. 22, 2011 which are all herein incorporated by reference for all purposes.

HPC™ processing techniques have been adapted to the development and investigation of absorber layers and buffer layers for TFPV solar cells as described in U.S. patent application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference for all purposes.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages may be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e. microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes may proceed to pilot manufacturing 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from HPC™ techniques described in U.S. patent application Ser. No. 11/674,137 filed on Feb. 12, 2007 which is hereby incorporated for reference for all purposes. Portions of the '137 application have been reproduced below to enhance the understanding of the present disclosure.

While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete site-isolated region. Furthermore, while different materials or unit processes may be used for corresponding layers or steps in the formation of a structure in different site-isolated regions of the substrate during the combinatorial processing, the application of each layer or use of a given unit process is substantially consistent or uniform throughout the different site-isolated regions in which it is intentionally applied.

Thus, the processing is uniform within a site-isolated region (inter-region uniformity) and between site-isolated regions (intra-region uniformity), as desired. It should be noted that the process may be varied between site-isolated regions, for example, where a thickness of a layer is varied or a material may be varied between the site-isolated regions, etc., as desired by the design of the experiment.

The result is a series of site-isolated regions on the substrate that contain structures or unit process sequences that have been uniformly applied within that site-isolated region and, as applicable, across different site-isolated regions. This process uniformity allows comparison of the properties within and across the different site-isolated regions such that the variations in test results are due to the varied parameter (e.g., materials, unit processes, unit process parameters, hardware details, or process sequences) and not the lack of process uniformity. In the embodiments described herein, the positions of the discrete site-isolated regions on the substrate may be defined as needed, but are preferably systematized for ease of tooling and design of experimentation. In addition, the number, variants and location of structures within each site-isolated region are designed to enable valid statistical analysis of the test results within each site-isolated region and across site-isolated regions to be performed.

Figure 2:
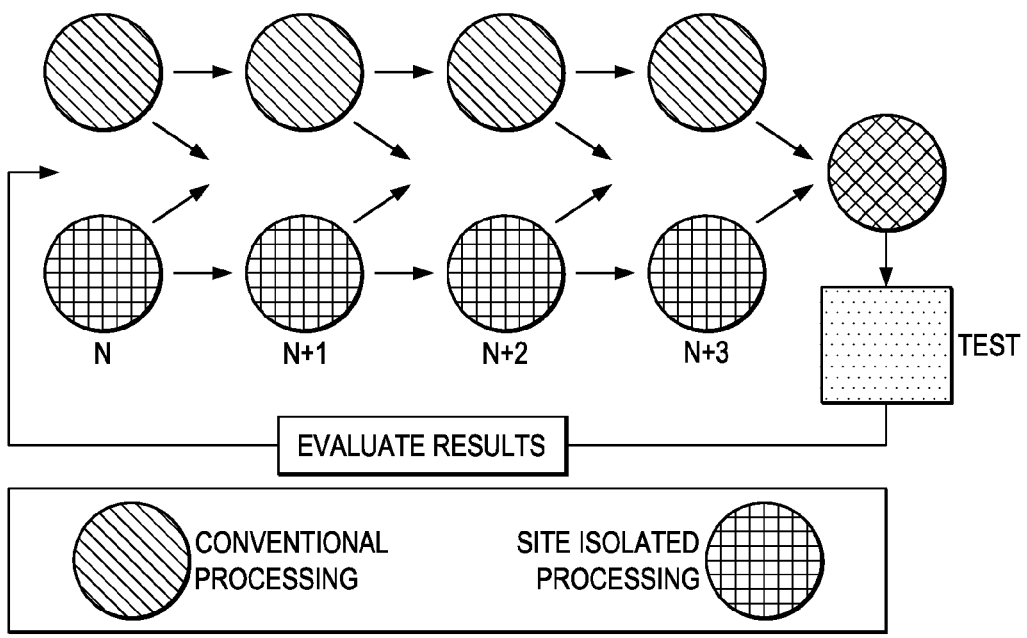
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing. In some embodiments, the substrate is initially processed using conventional process N. In some exemplary embodiments, the substrate is then processed using site isolated process N+1. During site isolated processing, an HPC™ module may be used, such as the HPC module described in U.S. patent application Ser. No. 11/352,077 filed on Feb. 10, 2006, which is incorporated herein by reference for all purposes. The substrate may then be processed using site isolated process N+2, and thereafter processed using conventional process N+3. Testing is performed and the results are evaluated. The testing may include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence may include processing the substrate using site isolated process N, conventional processing for processes N+1, N+2, and N+3, with testing performed thereafter.

It should be appreciated that various other combinations of conventional and combinatorial processes may be included in the processing sequence with regard to FIG. 2. That is, the combinatorial process sequence integration may be applied to any desired segments and/or portions of an overall process flow. Characterization, including physical, chemical, acoustic, magnetic, electrical, optical, etc. testing, may be performed after each process operation, and/or series of process operations within the process flow as desired. The feedback provided by the testing is used to select certain materials, processes, process conditions, and process sequences and eliminate others. Furthermore, the above flows may be applied to entire monolithic substrates, or portions of monolithic substrates such as coupons.

Under combinatorial processing operations the processing conditions at different site-isolated regions may be controlled independently. Consequently, process material amounts, reactant species, processing temperatures, processing times, processing pressures, processing flow rates, processing powers, processing reactant compositions, the rates at which the reactions are quenched, deposition order of process materials, process sequence steps, hardware details, etc., may be varied from site-isolated region to site-isolated region on the substrate. Thus, for example, when exploring materials, a processing material delivered to a first and second site-isolated regions may be the same or different. If the processing material delivered to the first site-isolated region is the same as the processing material delivered to the second isolated-region, this processing material may be offered to the first and second site-isolated regions on the substrate at different concentrations. In addition, the material may be deposited under different processing parameters. Parameters which may be varied include, but are not limited to, process material amounts, reactant species, processing temperatures, processing times, processing pressures, processing flow rates, processing powers, processing reactant compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used may be varied.

As mentioned above, within a site-isolated region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the site-isolated regions. It should be appreciated that a site-isolated region may be adjacent to another site-isolated region in some embodiments or the site-isolated regions may be isolated and, therefore, non-overlapping. When the site-isolated regions are adjacent, there may be a slight overlap wherein the materials or precise process interactions are not known, however, a portion of the site-isolated regions, normally at least 50% or more of the area, is uniform and all testing occurs within that site-isolated region. Further, the potential overlap is only allowed with material of processes that will not adversely affect the result of the tests. Both types of site-isolated regions are referred to herein as site-isolated regions or discrete site-isolated regions.

Substrates may be a conventional round 200 mm, 300 mm, or any other larger or smaller substrate/wafer size. In some embodiments, substrates may be square, rectangular, or any other shape. One skilled in the art will appreciate that substrate may be a blanket substrate, a coupon (e.g., partial wafer), or even a patterned substrate having predefined site-isolated regions. In some other embodiments, a substrate may have site-isolated regions defined through the processing described herein.

Software is provided to control the process parameters for each wafer for the combinatorial processing. The process parameters comprise selection of one or more source gases for the plasma generator, plasma filtering parameters, exposure time, substrate temperature, power, frequency, plasma generation method, substrate bias, pressure, gas flow, or combinations thereof.

The present disclosure provides a method of increasing the effective dielectric constant of dielectric films, such as $TiO_2$, within semiconductor-based capacitive devices. $TiO_2$ is a compound which occurs in various polymorphic forms in nature distinguishable by their crystal structures. For example, $TiO_2$ may have one of the following crystal structures: rutile, amorphous, anatase, or brookite.

$TiO_2$ materials having a rutile crystal structure are typically thermodynamically stable in bulk phase under ambient conditions. Further, these materials are anisotripic and exhibit high dielectric constant values in some crystal directions. For example, $TiO_2$ materials with rutile crystal structure may exhibit a dielectric constant value ranging from 86 to 170 depending on crystal direction.

In addition, $TiO_2$ materials may be deposited as having an amorphous crystal structure. As such, special processing may be needed to ensure for controlled rutile film growth formation despite bulk stability.

The anatase crystal structure forms eight-faced tetragonal dipyramids that come to sharp elongated points. The elongation is pronounced enough to distinguish this crystal form from octahedral crystals. At higher temperatures, about 915° Celsius, anatase will typically revert to the rutile structure. Anatase shares many of the same properties as rutile such as luster, hardness and density. However, due to structural differences, anatase and rutile differ slightly in crystal habit and more distinctly in cleavage. Moreover, anatase may be stablized in nanostructures by finite-size and surface effects.

Anatase and rutile have the same symmetry, tetragonal 4/m 2/m 2/m, despite having different structures. In a rutile crystal structure, the structure is based on octahedrons of titanium oxide which share two edges of the octahedron with other octahedrons and form chains. It is the chains themselves which are arranged into a four-fold symmetry. In anatase, the octahedrons share four edges hence the four fold axis. Notably, it has been discovered in the art that the dielectric constant value of anatase range from 48 to 58 for surface-stabilized materials.

Brookite has a larger cell volume than either anatase or rutile, with eight $TiO_2$ groups per unit cell, compared with four for anatase and two for rutile. Iron, tantalum, and niobium are common impurities. At higher temperatures, about 750° Celsius, brookite will typically revert to the rutile structure. Brookite shares many of the same properties as rutile such as color and luster and some properties are nearly the same such as hardness and density. However, due to structural differences brookite and rutile differ in crystal habit and cleavage.

It is known by one having ordinary skill in the art that $TiO_2$ materials having a rutile crystal structure are thermodynamically stable. Notably, the (110) crystal face of $TiO_2$ materials, with rutile crystal structure is believed to exhibit the lowest surface energy than any other crystal plane orientation in TiO$_2$ materials having a rutile crystal structure. In addition, the [001] crystal direction of TiO$_2$ materials having a rutile crystal structure render the highest dielectric constant values than any other crystal direction within TiO$_2$ materials with rutile crystal structure.

For example, the dielectric constant value of TiO$_2$ materials, with rutile crystal structure, along the (110) crystal plane may be as high as 170. However, the dielectric constant value of TiO$_2$ materials, having a rutile crystal structure, along other crystal planes and crystal directions may be as low as 86.

As a result of conventional semiconductor processing sequences and techniques, the effective dielectric constant of a bulk polycrystalline TiO$_2$ film is typically an average of the dielectric constant values of a TiO$_2$ material with a crystal structure along various planes of the TiO$_2$ unit cell weighted towards the lowest dielectric constant values ($\kappa_\perp$). The average value depends on crystallization microgeometry, but it can be approximately evaluated using the effective-medium approximation. For TiO$_2$ materials having a rutile crystal structure ($\kappa_\parallel$=86 and k$_\perp$=170), this renders an effective dielectric constant value, k$_{\mathit{eff}}$, of approximately 110. In addition, lower-k dielectric regions may be attributed to alloying or from various defects within the rutile crystal structure.

Figure 3:
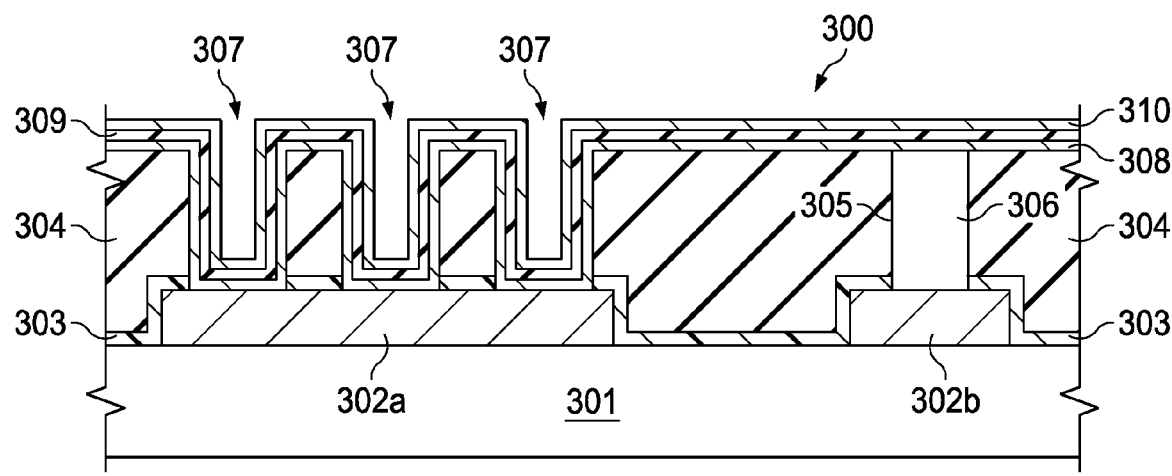
FIG. 3 is a schematic diagram of a prior art semiconductor device having a conventional capacitive structure.

FIG. 3 is a schematic diagram of a conventional semiconductor structure 300 having a conventional capacitive structure. For example, conventional semiconductor structure 300 comprises an interlayer dielectric layer 301 with interconnection conductive layers 302a, 302b disposed thereon.

The interconnection conductive layers 302a, 302b may comprise aluminum (Al), aluminum-alloy, copper (Cu), tungsten (W) or molybdenum (Mo). In some embodiments, the thickness of each interconnection conductive layer 302a, 302b is between approximately 100 and 1,000 nm.

As shown, an etch stop layer 303 may be formed on an surface within the semiconductor structure 300 around the area where interconnection conductive layers 302a, 302b are formed. Etch stop layer 303 may comprise silicon nitride (Si$_3$N$_4$), silicon carbide (SiC) or silicon carbonitride (SiCN) formed using any suitable process such as, but not limited to, plasma enhanced chemical vapor deposition (PECVD). Etch stop layer 303 may have a thickness in the range of 100-1,000 Å.

In addition, after an intermetal dielectric layer 304 is formed on the etch stop layer 303, the intermetal dielectric layer 304 is planarized. The intermetal dielectric layer 304 may comprise SiO$_2$, SiOC, SiOH, or SiOCH.

In addition, a barrier material 306 may be formed within trench 305. The barrier material 306 may comprise Ta, TaN, TiN, WN, TaC, WC, TiSiN, or TaSiN and may be formed in the trench 305 by any suitable process such as a PVD (Physical Vapor Deposition), CVD (Chemical Vapor Deposition) or ALD (Atomic Layer Deposition). The barrier material 306 in the trench 305 may comprise a conductive material such as tungsten.

Furthermore, conventional semiconductor structure 300 includes a plurality of trenches 307 in which capacitive structures can be formed therein. Within each trench 307, is a bottom electrode layer 308, a dielectric material layer 309 disposed on the bottom electrode layer 308, and a top electrode layer 310 disposed on the dielectric material layer 309. Accordingly, collectively, the bottom electrode layer 308, dielectric material layer 309, and top electrode layer 310 within each trench 307 functions as a capacitive device.

Figure 4:
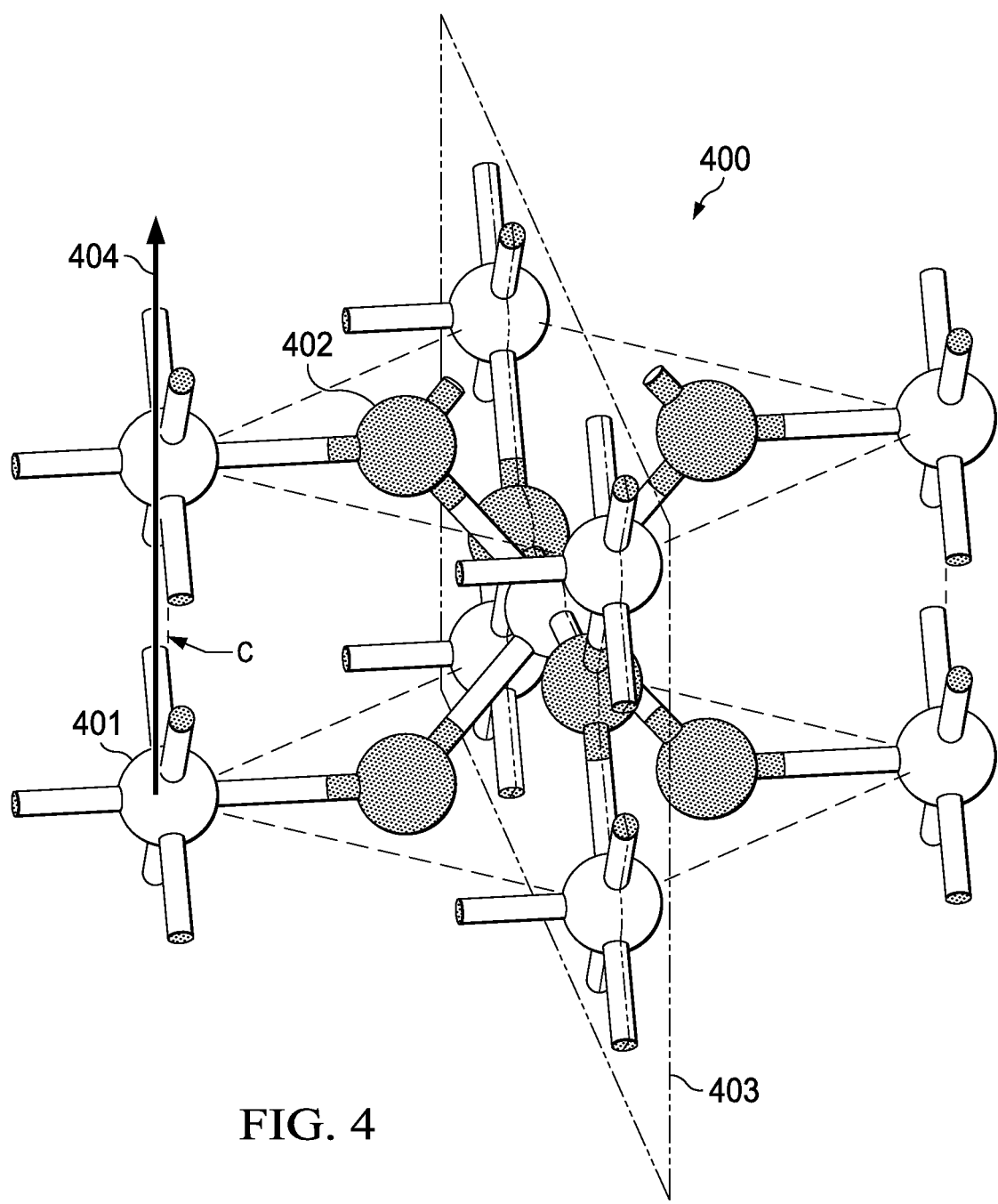
FIG. 4 is a simplified schematic diagram illustrating a perspective view of a rutile crystal structure of a $TiO_2$ unit cell.

FIG. 4 is a simplified schematic diagram illustrating a perspective view of a rutile crystal structure of a TiO$_2$ unit cell 400 having a rutile crystal structure. As shown, unit cell 400 includes titanium atoms 401 at the corners and both oxygen atoms 402 and titanium atoms 401 near the interior of the TiO$_2$ unit cell 400.

FIG. 4 further illustrates an exemplary (110) crystal plane 403 extending throughout the TiO$_2$ unit cell 400. The (110) crystal plane 403 is believed to be the lowest energy surface orientation of a TiO$_2$ material having a rutile crystal structure. Furthermore, an arrow 404 extends in a [001] crystal direction. It can be seen that the direction is parallel to the (110) crystal plane.

It should be understood that the TiO$_2$ unit cell 400 shown in FIG. 4 is exemplary and therefore the size, location, and distance between neighboring atoms may not be exact. Accordingly, the TiO$_2$ unit cell 400 shown in FIG. 4 is for illustrative purposes.

Figure 5A:
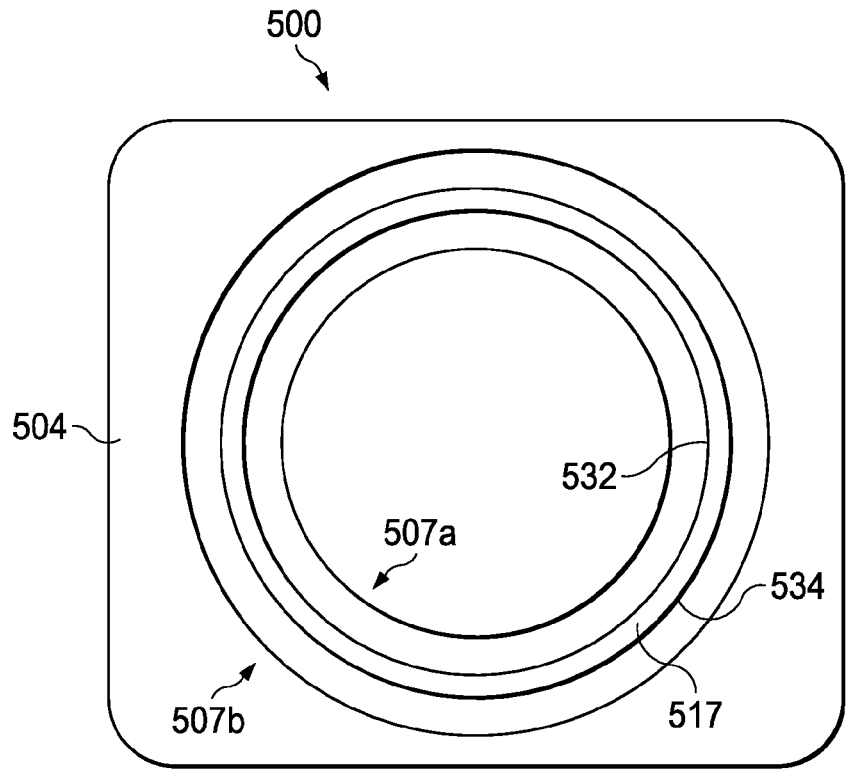
FIG. 5A is a simplified schematic diagram illustrating a top view of a semiconductor structure having trenches with a concentric shape.

FIG. 5A is a simplified schematic diagram illustrating a top view of a semiconductor structure 500 having trenches 507a, 507b with a circular, concentric shape. In some embodiments, the trenches 507a, 507b are formed in an anisotropic dielectric layer surface 504. As such, the surface (e.g. walls) of the trenches 507a, 507b may be substantially perpendicular to the dielectric layer surface 504.

Dielectric layer surface 504 may comprise a TiO$_2$ film having a rutile crystal structure. In some embodiments, a GeO$_2$ material may be suitable for dielectric layer surface 504.

In addition, a dielectric region 517 is disposed between trenches 507a, 507b. In some embodiments, dielectric region 517 is a portion of dielectric layer surface 504. As shown in FIG. 5A, dielectric region 517 is disposed between outside wall 532 of trench 507a and the inside wall 534 of trench 507b. Notably, dielectric region 517 functions as the dielectric material within a capacitive device formed within the semiconductor structure 500.

In some embodiments, because of surface energetics, the highest dielectric crystal direction, the [001] crystal direction, is parallel to the dielectric layer surface 504 and therefore the dielectric region 517. As such, portions of the dielectric region 517 will lie at or near the highest dielectric crystal direction and other portions of the dielectric region 517 will lie away from the highest dielectric crystal direction. As such, dielectric region 517 may be referred to as "partially oriented."

Advantageously, the effective dielectric constant value of the dielectric region 517 will be an average of the dielectric constant values of each dielectric region portion along the perimeter of the dielectric region 517 such that the dielectric constant value of each dielectric region portion between each trench portion is given equal weight in the overall effective dielectric constant value of the dielectric region 517.

Figure 5B:
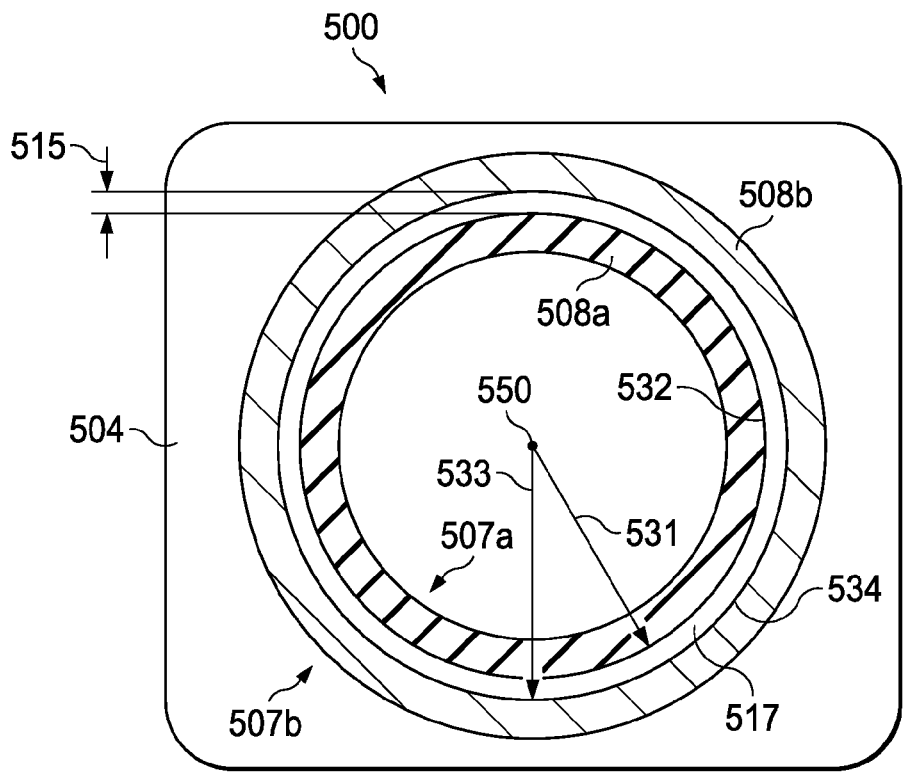
FIG. 5B is a simplified schematic diagram illustrating a top view of a semiconductor structure having trenches with a concentric shape with electrodes therein.

FIG. 5B is a simplified schematic diagram illustrating a top view of a semiconductor structure 500 having trenches 507a, 507b with a concentric shape with electrodes 508a, 508b therein. In some embodiments, electrodes 508a, 508b comprise conductive materials. For example, the conductive materials may comprise any of tungsten (W), nickel (Ni), tantalum nitride (TaN), platinum (Pt), tungsten nitride (WN) titanium (Ti), titanium nitride (TiN), titanium aluminum nitride (TiAlN), ruthenium (Ru), and iridium (Ir).

The distance 515 between each trench 507a, 507b, or the width of the dielectric region 517, may be designed to function according to a particular type of capacitor. For example, the distance 515 between each trench 507a, 507b, may be small such that the capacitive device formed in the semiconductor structure 500 functions as a parallel plate capacitive device.

In some embodiments, when the capacitive structure functions as a parallel plate capacitive device, the ratio of the radius 531 of the first trench 507a and the radius 533 of the second trench 507b may be in the range from 0.9 to 0.99. In some embodiments, radius 531 is the distance from common center of curvature point 550 to the outside wall 532 of trench 507a. Furthermore, radius 533 is shown to be the distance from common center of curvature point 550 to the inside wall 534 of trench 507b. In some embodiments, different values of the ratio of the aforementioned radii are possible, and/or the centers of curvature of the walls 532 and 534 may not be located at substantially the same point, although the properties of such embodiments may substantially deviate from those of parallel plate capacitors.

Figure 6:
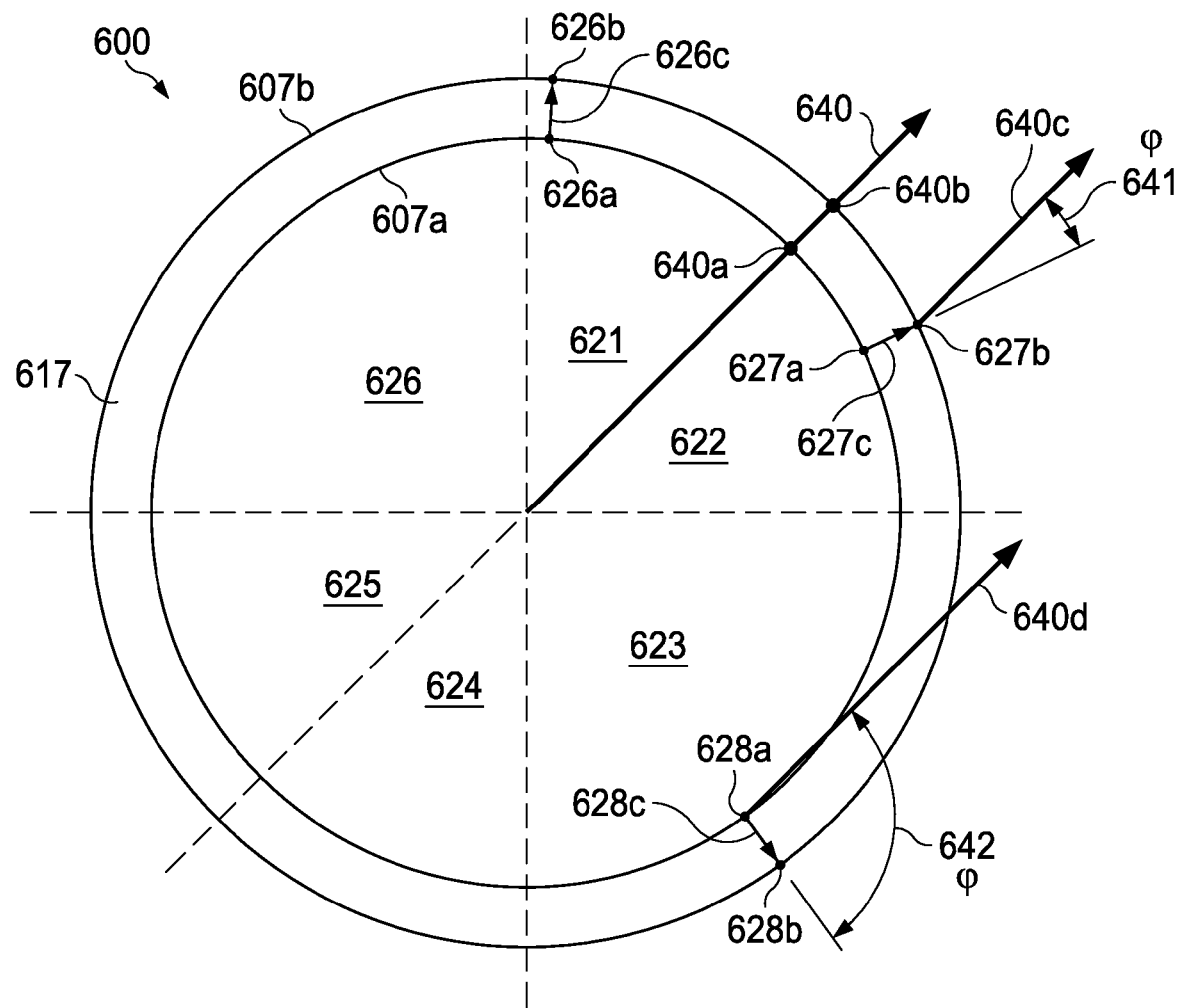
FIG. 6 is schematic diagram of the semiconductor structure shown in FIG. 5B illustrating an exemplary high dielectric crystal direction and exemplary directions of the electric fields between the electrodes of each trench.

FIG. 6 is schematic diagram of the semiconductor structure 600 shown in FIG. 5B illustrating an exemplary highest dielectric crystal direction 640 and exemplary directions of the electric fields between the electrodes (not shown) of each trench 607a, 607b. Further, FIG. 6 illustrates various regions 621-626 of a semiconductor structure 600 having a capacitive device formed therein.

Of particular interest is the exemplary highest dielectric crystal direction (line 640) which is parallel to the surface of the dielectric region 617. It should be appreciated by one having ordinary skill in the art that the crystal direction in which the dielectric region 617 exhibits the highest dielectric constant value may lie anywhere within the plane of region 617. As such, highest dielectric crystal direction (line 640) is exemplary, and does not denote the specific direction to which the trenches 607a, 607b exhibit the highest dielectric constant value.

It should be further understood by one having ordinary skill in the art that the crystal direction (i.e. the [001] crystal direction) in which the dielectric region 617 exhibits the highest dielectric constant value is parallel to the surface of the dielectric region 617 because the material(s) in which the dielectric region was formed, was formed vertically from a surface (e.g. semiconductor substrate 600).

Taking line 640 as the line drawn through the common center of the trenches 607a, 607b along the crystal direction in which the dielectric region 617 exhibits the highest dielectric constant value, the portions of the dielectric region 617 which are proximate thereto exhibit dielectric constant values that are relatively close to this highest dielectric constant value.

In some embodiments, "proximate" may be considered any portion of the dielectric region 617 which is within 45 degrees from the portions (e.g. 640a, 640b) of the dielectric region 617 that lie on the line 640 drawn through the common center of the trenches 607a, 607b along the highest dielectric crystal direction.

For example, the portions of the dielectric region 617 in regions 621, 622 are within approximately 45 degrees from the line 640. Therefore, according to some embodiments, the dielectric constant values of the portions of the dielectric region 617 within regions 621, 622 are relatively close to the highest dielectric constant.

FIG. 6 illustrates trench portions 627a, 627b, within region 622. The "local" direction 627c of the electric field, induced due to the electrodes (not shown) formed within the trenches 607a, 607b, is shown to be perpendicular to the surface of each trench portion 627a, 627b.

Trench portions 627a, 627b are relatively close to trench portions 640a, 640b, which are shown along the highest dielectric crystal direction 640. Accordingly, the "local" dielectric constant value exhibited by the dielectric region portion between trench portions 627a, 627b should be relatively close to the dielectric constant value (i.e. the highest dielectric constant value) exhibited by the dielectric region between trench portions 640a, 640b.

In addition, the local dielectric constant value of the dielectric region portion between trench portions 627a, 627b can be calculated once an angle 641, (I), between the direction 627c of the "local" electric field and the high-k dielectric crystal direction 640c is known. The local dielectric constant value of the dielectric region portion between trench portions 627a, 627b can be calculated accordingly: $k_{local} = \kappa_\perp \sin^2\phi + \kappa_\parallel \cos^2\phi$. In some embodiments, $\kappa_\perp$ and $\kappa_\parallel$ are believed to be 86 and 170 respectively for $TiO_2$ materials having a rutile crystal structure.

FIG. 6 illustrates another pair of trench portions 626a, 626b, along with the direction 626c of the electric field within region 621. Because trench portions 626a, 626b lie within region 621, the dielectric constant values exhibited within this region 621 are close to the dielectric constant value along the highest dielectric crystal direction (line 640).

In contrast, the dielectric constant values of the dielectric region portion between trench portions 628a, 628b, in region 623, may be significantly lower than the highest dielectric constant value because the dielectric region portion between trench portions 628a, 628b lie outside of regions 621, 622. Notably, the angle 642, $\phi$, between the direction 628c of the "local" electric field and the high-k dielectric crystal direction 640d is significantly larger than the angle 641 between the direction 627c and the high-k dielectric crystal direction 640c (supra).

It should be understood by one having ordinary skill in the art that because trenches 607a, 607b have circular, concentric shapes, the direction of the electric field between each corresponding trench portion will change along the perimeter of the trenches 607a, 607b. Therefore, the local dielectric constant value will vary along the perimeter of the dielectric layer 617. Most notably, the effective dielectric constant value, $k_{eff}$, of the dielectric layer 617 can be calculated by using an integration method to sum up the local dielectric constant values of each dielectric region portion between trench portions of trenches 607a, 607b.

Alternatively, in the case when trenches 607a, 607b have circular, concentric shapes, an approximate effective dielectric constant value can be calculated as follows: $k_{eff} = (\kappa_\perp + \kappa_\parallel)/2$. One having ordinary skill in the art should appreciate that the effective dielectric constant value of dielectric layer 617 can be calculated by various methods and the aforementioned methods are not exhaustive.

Figure 8:
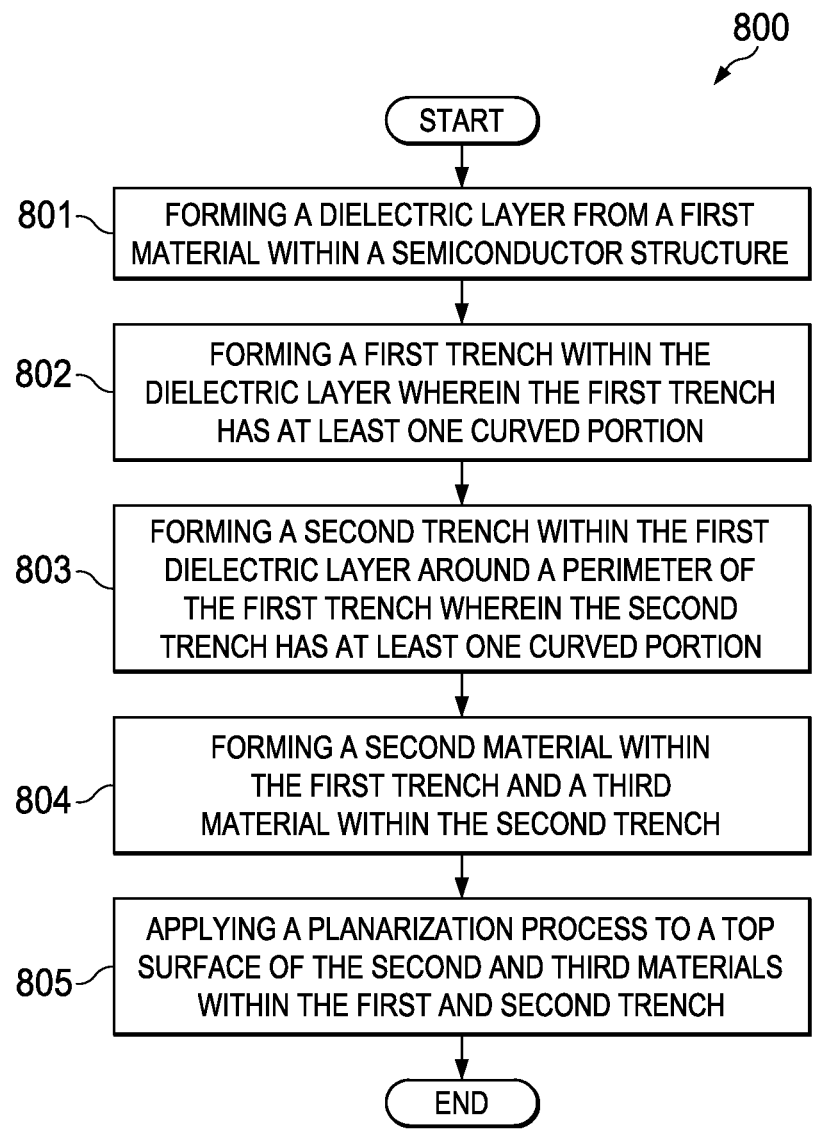
FIG. 8 is a method of forming the semiconductor structure shown in FIG. 5B.

FIG. 8 is a method 800 of forming the semiconductor structure 500 shown in FIG. 5B. Notably, the semiconductor structure to be formed has a capacitive device therein having a dielectric region with an effective dielectric constant value that is higher than those within conventional capacitive devices.

Figure 7A:
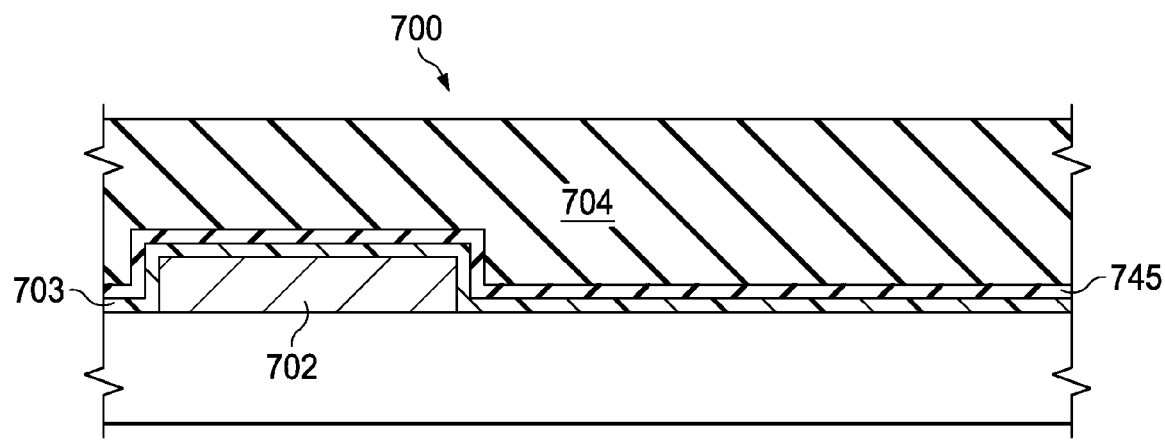
FIGS. 7A-7D are schematic diagrams illustrating cross-sectional views of a method of forming the semiconductor structure shown in FIG. 5B.

The method 800 will be described in reference to FIGS. 7A-7D. FIG. 7A illustrates the semiconductor structure 700. Semiconductor structure 700 includes a dielectric layer 704 formed upon a conductive rutile oxide layer 745 which is formed on etch stop 703 disposed upon an interconnection conductive layer 702. Exemplary conductive rutile oxide layers 745 may include $RuO_2$ and $MoO_2$.

Step 801 provides forming a dielectric layer 704 from a first material within a semiconductor structure 700. In some embodiments, the first material has a polycrystalline structure and has at least one physical or electrical property which varies according to a crystal direction. Most notably, a preferred crystal direction for high-k is parallel to the surface of the first material. The preferred crystal direction can be achieved by depositing the first material vertically upon the semiconductor structure 700 or by other deposition techniques.

For example, a polycrystalline material may be deposited having relatively large-sized crystallites (i.e. grains) upon a substrate, so that the orientation of each crystallite is defined by the surface energetics of the free surface during growth. Alternatively, the first material can be a single crystal.

The dielectric layer 704 may have a polycrystalline structure and may exhibit anisotropic properties at least with regards to the dielectric constant value. In some embodiments, the dielectric layer 704 may include $TiO_2$ having a rutile crystal structure. Other suitable materials may include $GeO_2$ or $SnO_2$.

Dielectric layer 704 may be formed by any suitable method such as, but not limited to, atomic layer deposition (ALD), chemical vapor deposition (CVD), or plasma enhanced chemical vapor deposition (PECVD).

In some embodiments, a substrate may be chosen to have a structure matching that of the dielectric film, e.g., a structure having a rutile crystal structure. For example, prior to forming the dielectric layer 704 within the semiconductor structure 700, a conductive rutile oxide layer 745 may be formed. In some embodiments, the conductive rutile oxide layer 745 is formed on a surface within the semiconductor structure 700, such as etch stop 703, and the dielectric layer 704 is formed thereafter as shown in FIG. 7A.

It is known by those having ordinary skill in the art that crystalline molecular sites on a surface of a conductive rutile oxide layer 745 can guide titanium atoms into positions which correspond to the positions of titanium atoms in a rutile crystalline structure. Therefore, with the initial titanium atoms in place for a rutile crystalline structure, the oxygen atoms may arrange in appropriate positions to continue growth of a $TiO_2$ layer having a rutile crystalline structure.

Accordingly, a conductive rutile oxide layer 745 may function as a template for forming the $TiO_2$ dielectric layer 704 having a rutile crystal structure. Notably, because the conductive rutile oxide layer 745 has a crystal structure similar to the crystal structure of the $TiO_2$ dielectric layer 704, the $TiO_2$ dielectric layer 704 may adopt the rutile crystal structure even at low process temperatures.

For example, to form a $TiO_2$ dielectric film having a rutile crystal structure, the process temperature required may be close to 700° C. or more. However, because the conductive rutile oxide layer 745 has a rutile crystal structure, the $TiO_2$ dielectric layer 704 can be formed at a process temperature of 400° C. or less according to some embodiments.

As discussed above, dielectric layer 704 can be uniformly formed using a CVD or ALD method. In some embodiments, $TiO_2$ dielectric layer 704 may be formed by an ALD method as described below.

In some embodiments, first a titanium precursor may be supplied to a process reaction chamber. In some embodiments, a titanium precursor may be supplied to a process reaction chamber having a semiconductor structure 700 therein at a process temperature of approximately 200-400° C. for 0.1-3 seconds. In some embodiments, when the titanium precursor is supplied to the semiconductor structure 700, a portion of the titanium precursor supplied is adsorbed in a surface of the semiconductor structure, and among the adsorbed titanium precursor, a chemically adsorbed titanium precursor forms a titanium metal layer.

Next, purging any lingering titanium precursor from the process reaction chamber. A purge gas can be an inert gas such as Ar gas or $N_2$ gas. The purge gas removes the titanium precursor which is not chemically adsorbed from the process reaction chamber. The purge gas may be supplied to the process reaction chamber for approximately 0.1-3 seconds.

Next, in some embodiments, an oxidant may be supplied to the process reaction chamber. The oxidant can be ozone gas, a water vapor ($H_2O$), or oxygen plasma. In some embodiments, the oxidant is supplied at a process temperature of approximately 200-400° C. for about 10 seconds. The oxidant may chemically react with the titanium metal layer to form a $TiO_2$ dielectric layer 704 on a conductive rutile oxide layer 745. Alternatively, a higher process temperature may be used when the $TiO_2$ dielectric layer 704 is formed on a surface of the semiconductor structure 700 that does not include a conductive rutile oxide layer 745.

In some embodiments, when the ozone gas is used as an oxidant, the amount of ozone gas may be in the range from 100 to 500 $g/m^3$. As the ozone gas supply time increases, the thickness and density of the $TiO_2$ dielectric layer 704 also increases, but the density of titanium in the $TiO_2$ dielectric layer reduces. In some embodiments, the $TiO_2$ dielectric layer 704 exhibits better electrical properties (e.g. as an equivalent oxide thickness, a leakage current density), or the like, for extended ozone gas supply times.

Next, purging any lingering oxidant from the process reaction chamber. In particular, a purge gas can remove any portion of the oxidant which does not react within the reaction chamber. In some embodiments, the type of purge gas, supply time, and supply temperature can be the same as in the titanium precursor purge process. Additionally, a $TiO_2$ deposition cycle previously described may be repeated a few times to form a $TiO_2$ dielectric layer 704 having a rutile crystal structure with a desired thickness.

Next, step 802 provides forming a first trench 707a within the dielectric layer 704 wherein the first trench 707a has at least one curved portion (shown in FIG. 5B). In addition, step 803 provides forming a second trench 707b around a perimeter of the first trench 707a wherein the second trench 707b also has at least one curved portion (shown in FIG. 5B). In some embodiments, each trench 707a, 707b has at least one curved portion along a horizontal plane of the semiconductor structure 700. Furthermore, a degree of curvature of curved portions of the first trench 707a and the second trench 707b are different.

Figure 7B:
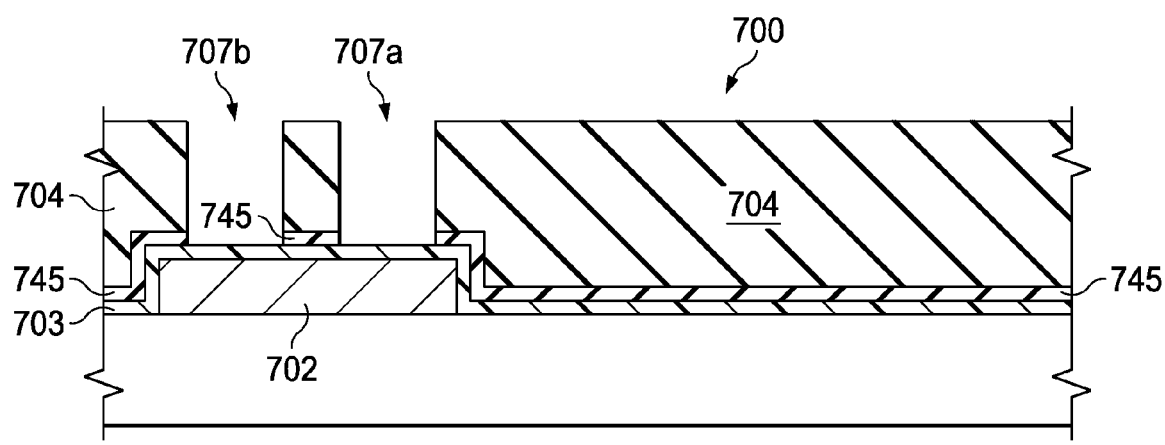

Referring to FIG. 7B, portions of the dielectric layer 704 and the conductive rutile oxide layer 745 are shown to have been selectively etched (e.g. using a photoresist pattern) to form a plurality of trenches 707a, 707b exposing the etch stop 703.

In some embodiments, in order to form trenches 707a, 707b that have a substantially concentric shape along a horizontal plane of the semiconductor structure 700, a reactive-ion-etching (RIE) technique may be utilized. In some embodiments, a $SF_6/CF_4$ RIE silicon etch chemistry and mask is used to define the area to be etched in dielectric layer 704 and conductive rutile oxide layer 745, thereby forming continuous, concentric trench patterns.

In some embodiments, the first and second trenches 707a, 707b are formed simultaneously within the dielectric layer 704 and conductive rutile oxide layer 745. Alternatively, the first and second trenches 707a, 707b are formed in sequence.

In some embodiments, the depth of each trench 707a, 707b may extend to a depth less than or equal to 100 nm. One having ordinary skill in the art should appreciate that the depth of each trench 707a, 707b may be chosen to maintain the physical integrity of the trench structures.

In addition, the distance between each trench 707a, 707b, particularly electrodes 708a, 708b, may be in the range from 3-20 nm. In some embodiments, the distance between each electrode 708a, 708b is between 5 and 10 nm.

Figure 7C:
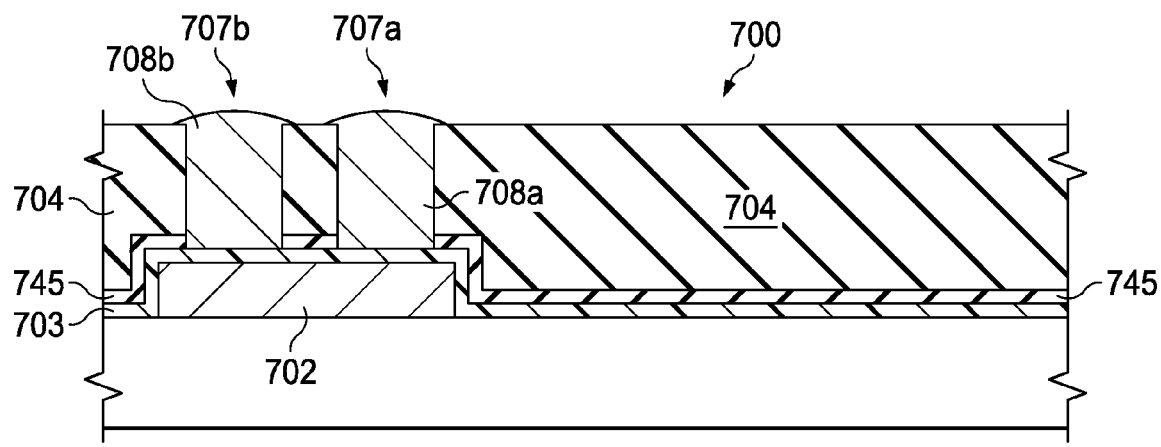

Next, according to step 804, forming a second material 708a within trench 707a and a third material 708b within trench 707b as shown in FIG. 7C. The second and third material 708a, 708b may comprise any of W, Ni, TaN, Pt, WN, Ti, TiN, TiAlN, Ru, or Ir. Most importantly, the second and third materials function as electrodes of a capacitive device. In some embodiments, the second and third materials are different. For example, it may be desirable in some applications for second and third materials 708a, 708b to be different such that the electrodes have different work functions.

Figure 7D:
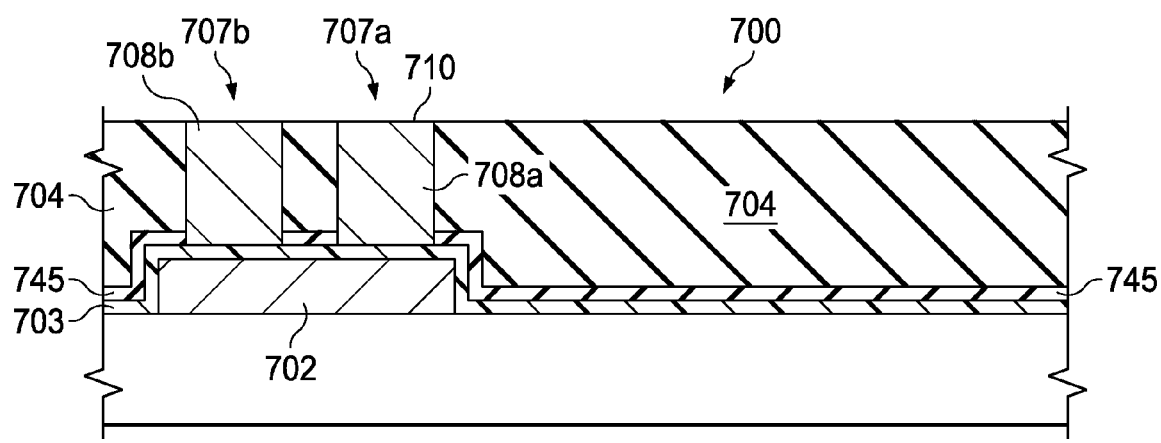

Finally, method 800 concludes with step 805, applying a planarization process to a top surface 710 of the second and third materials 708a, 708b formed within the trenches 707a, 707b as shown in FIG. 7D. In some embodiments, a chemical mechanical planarization (CMP) process is utilized to planarize the top surface of the second and third materials 708a, 708b.

Figure 9A:
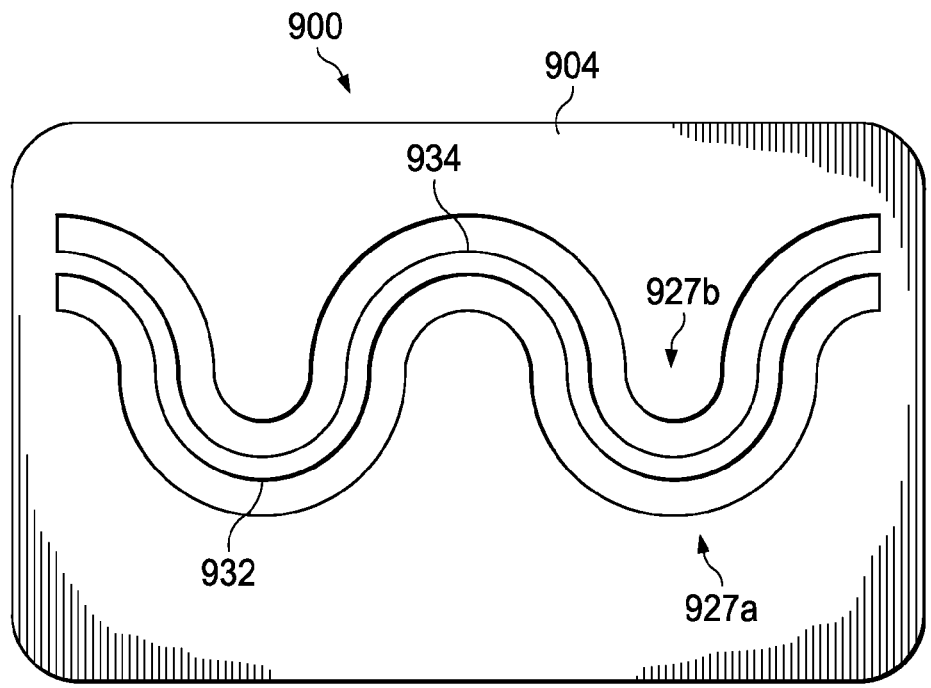
FIG. 9A is a schematic diagram illustrating a top view of the semiconductor structure having parallel wave-shaped trench patterns.

FIG. 9A is a schematic diagram illustrating a top view of the semiconductor structure 900 having parallel wave-shaped trench patterns. In some embodiments, the depth of each trench 927a, 927b may extend to approximately 100 nm.

Dielectric layer surface 904 may comprise a $TiO_2$ film having a rutile crystal structure. In some embodiments, $GeO_2$ or $SnO_2$ materials may be suitable for dielectric layer surface 904. In addition, a dielectric region 917 is disposed between trenches 907a, 907b. As shown in FIG. 9A, dielectric region 917 is disposed between outside wall 932 of trench 927a and the inside wall 934 of trench 927b. Notably, dielectric region 917 functions as the dielectric material within a capacitive device formed within the semiconductor structure 900.

In some embodiments, because of surface energetics, the highest dielectric crystal direction, the [001] crystal direction, is known to lie somewhere within the plane of the dielectric layer surface 904 and therefore the dielectric region 917. As such, portions of the dielectric region 917 will lie at or near the highest dielectric crystal direction and other portions of the dielectric region 917 will lie away from the highest dielectric crystal direction. As such, dielectric region 917 may be referred to as "partially oriented."

Advantageously, the effective dielectric constant value of the dielectric region 917 will be an average of the dielectric constant values of each dielectric region portion along the perimeter of the dielectric region 917 such that the dielectric constant value of each dielectric region portion between each trench portion is given equal weight in the overall effective dielectric constant value of the dielectric region 917.

Figure 9B:
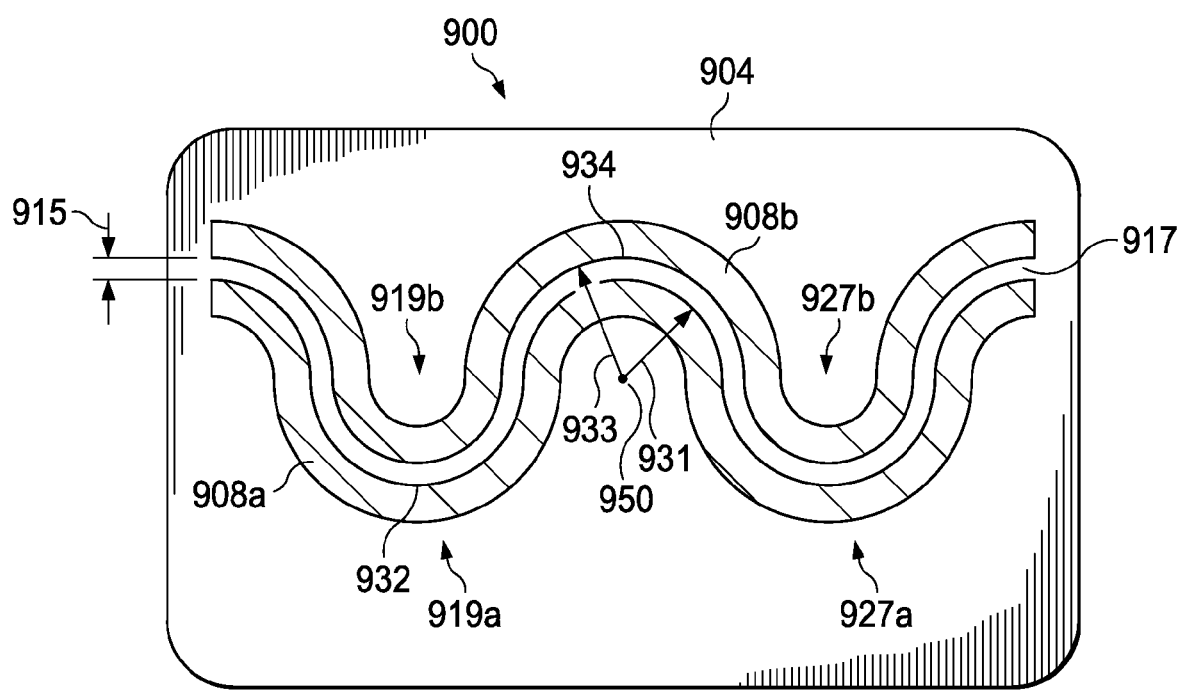
FIG. 9B is a schematic diagram illustrating a top view of the semiconductor structure having parallel wave-shaped trench patterns with electrodes formed therein.

FIG. 9B is a schematic diagram illustrating a top view of the semiconductor structure 900 having parallel wave-shaped trench patterns with electrodes 908a, 908b formed therein. In some embodiments, electrodes 908a, 908b comprise conductive materials. For example, the conductive materials may comprise any of tungsten (W), nickel (Ni), tantalum nitride (TaN), platinum (Pt), tungsten nitride (WN) titanium (Ti), titanium nitride (TiN), titanium aluminum nitride (TiAlN), ruthenium (Ru), and iridium (Ir).

Of particular interest is the distance 915 between each trench 927a, 927b which may be small such that the electrodes 908a, 908b of each trench 927a, 927b are close together. In some embodiments, the distance 915 between each trench 927a, 927b is much smaller than the curved portions 919a, 919b of the trenches 927a, 927b.

In some embodiments, when the capacitive structure functions as a parallel plate capacitive device, the ratio of the radius 931 of the first trench 927a and the radius 933 of the second trench 927b may be in the range from 0.9 to 0.99. As shown in the figure, radius 931 is the distance from common center of curvature point 950 to the outside wall 932 of trench 927a. Furthermore, radius 933 is shown to be the distance from common center of curvature point 950 to the inside wall 934 of the trench 927b. In some embodiments, different values of the ratio of the aforementioned radii are possible, and/or the centers of curvature of the walls 932 and 934 may not be located at substantially the same point, although the properties of such embodiments may substantially deviate from those of parallel plate capacitors.

Figure 10:
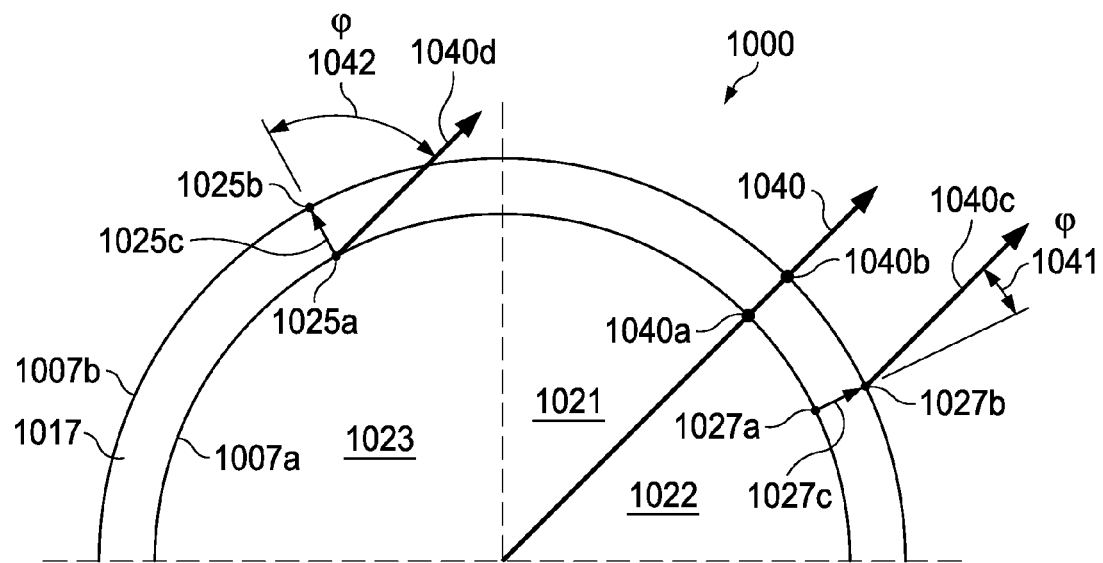
FIG. 10 is schematic diagram of the semiconductor structure shown in FIG. 9B illustrating a high dielectric crystal direction and directions of the electric fields between the electrodes of each trench.

FIG. 10 is schematic diagram of the semiconductor structure 1000 shown in FIG. 9B illustrating a high dielectric crystal direction and directions of the electric fields between the electrodes of each trench. FIG. 10 further illustrates various regions 1021-1023 of a semiconductor structure 1000 having a capacitive device formed therein.

Of particular interest is the exemplary highest dielectric crystal direction (line 1040) which is parallel to the surface of the dielectric region 1017. It should be appreciated by one having ordinary skill in the art that the crystal direction in the dielectric region 1017 exhibits the highest dielectric constant value may lie anywhere within the dielectric region 1017. As such, highest dielectric crystal direction (line 1040) is exemplary, and does not denote the specific direction to which dielectric region 1017 exhibits the highest dielectric constant value.

Taking line 1040 as the crystal direction which the dielectric region 1017 exhibits the highest dielectric constant value, the portions of the dielectric region 1017 which are proximate thereto exhibit dielectric constant values that are relatively close to the highest dielectric constant value.

In some embodiments, "proximate" may be considered any portion of the dielectric region 1017 that are within 45 degrees from the portions of the dielectric region 1017 that lie along the highest dielectric crystal direction 1040.

For example, the portions of the dielectric region 1017 within regions 1021, 1022 are within approximately 45 degrees from the highest dielectric crystal direction 1040. Therefore, according to some embodiments, the dielectric constant values of the portions of the dielectric region 1017 within these regions are relatively close to the highest dielectric constant value within the dielectric region 1017.

For example, trench portions 1027a, 1027b, within region 1022, represent very small portions of trenches 1007a, 1007b. The "local" direction 1027c of the electric field induced due to the electrodes (not shown) formed within the trenches 1007a, 1007b, is shown to be perpendicular to the surface of each trench portion 1027a, 1027b.

Trench portions 1027a, 1027b are relatively close to trench portions 1040a, 1040b, along the highest dielectric crystal direction (line 1040). Accordingly, the "local" dielectric constant value exhibited by the dielectric region between trench portion 1027a, 1027b should be relatively close to the dielectric constant value exhibited by the dielectric region portion between trench portions 1040a, 1040b.

In particular, the local dielectric constant value of the dielectric region between trench portions 1027a, 1027b can be calculated once the angle 1041, $\phi$, between the direction 1027c of the "local" electric field and the high-k dielectric crystal direction 1040c is known. The local dielectric constant value of the dielectric region portion between trench portions 1027a, 1027b can be calculated accordingly: $k_{local} = \kappa_\perp \sin^2\phi + \kappa_\parallel \cos^2\phi$. In some embodiments, $\kappa_\perp$ and $\kappa_\parallel$ are believed to be 86 and 170 respectively for $TiO_2$ materials having a rutile crystal structure.

FIG. 10 illustrates another pair of trench portions 1025a, 1025b, along with the direction 1025c of the electric field within region 1023. Because the dielectric region portion between trench portions 1025a, 1025b lie outside of regions 1021, 1022, the angle 1042, φ, between the direction 1025c of the "local" electric field and the high-k dielectric crystal direction 1040d is significantly larger than the angle 1041 between the direction 1027c and the high-k dielectric crystal direction 1040c (supra).

It should be understood by one having ordinary skill in the art that because trenches 1007a, 1007b have circular, concentric shapes, the direction of the electric field between each corresponding trench portion will change along the perimeter of the trenches 1007a, 1007b. Therefore, the dielectric constant value will also vary along the perimeter of the dielectric layer 1017.

The effective dielectric constant value, $k_{eff}$, of the dielectric layer 1017 can be calculated by using an integration method to sum up the local dielectric constant values of each dielectric region portion between trench portions along trenches 1007a, 1007b. Alternatively, an approximate effective dielectric constant value can be calculated as follows: $k_{eff} = (\kappa_\perp + \kappa_\parallel)/2$. One having ordinary skill in the art should appreciate that the effective dielectric constant value of dielectric layer 1017 can be calculated by various methods and the aforementioned methods are not exhaustive.

Figure 12:
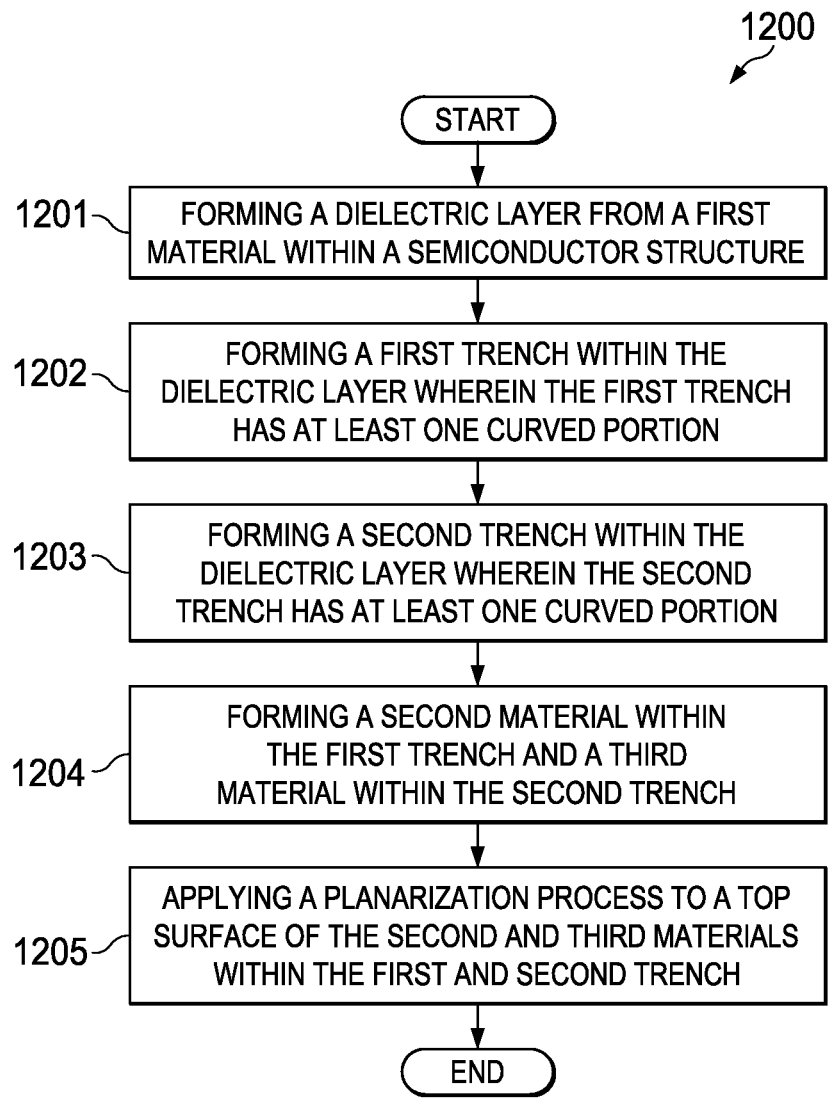
FIG. 12 is a method of forming the semiconductor structure shown in FIG. 9B.

FIG. 12 is a method of forming the semiconductor structure shown in FIG. 9B. Notably, the semiconductor structure to be formed has a capacitive device therein having a dielectric region with an effective dielectric constant value that is higher than those within conventional capacitive devices.

Figure 11A:
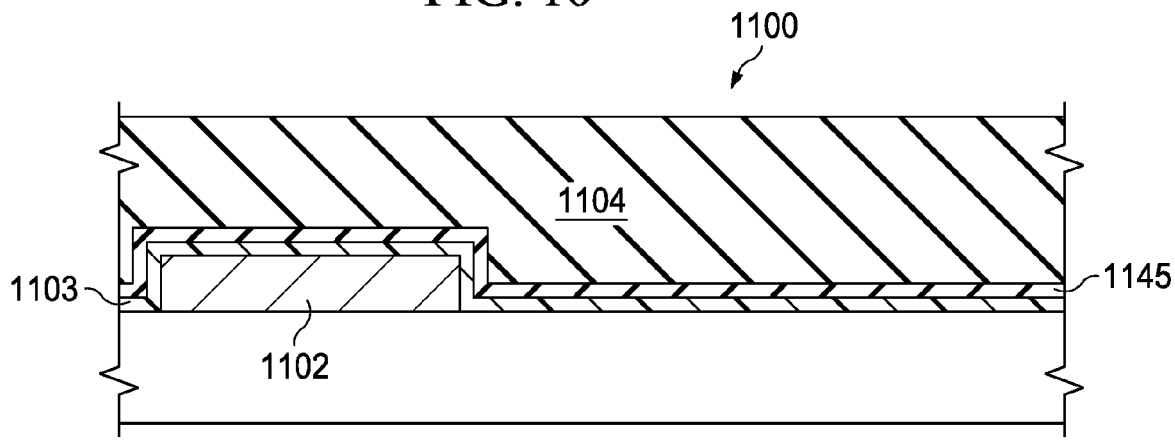
FIGS. 11A-11D are schematic diagrams illustrating cross-sectional views of a method of forming the semiconductor structure shown in FIG. 9B.

The method 1200 will be described in reference to FIGS. 11A-11D. FIG. 11A illustrates the semiconductor structure 1100. Semiconductor structure 1100 includes a dielectric layer 1104 formed upon a conductive rutile oxide layer 1145 which is formed on etch stop 1103 disposed upon an interconnection conductive layer 1102. Exemplary conductive rutile oxide layers 1145 may include $RuO_2$ and $MoO_2$.

Step 1201 provides forming a dielectric layer 1104 from a first material within a semiconductor structure 1100. In some embodiments, the first material has a polycrystalline structure and has at least one physical or electrical property which varies according to a crystal direction.

For example, the first material (and therefore dielectric layer 1104) may be formed within semiconductor structure 1100 such that a preferred crystal direction for high-k is parallel to the surface of the dielectric layer 1104 by depositing a polycrystalline material having relatively large-sized crystallites (i.e. grains) upon a substrate, so that the orientation of each crystallite is defined by the surface energetics of the free surface during growth.

Alternatively, the entire first material can be a single crystal. In some embodiments, a substrate may be chosen to have a structure matching that of the dielectric film, e.g., a structure having a rutile crystal structure.

The dielectric layer 1104 may have a polycrystalline structure and may exhibit anisotropic properties at least with regards to the dielectric constant value. In some embodiments, the dielectric layer 1104 may include $TiO_2$ having a rutile crystal structure. Other suitable materials may include $GeO_2$ or $SnO_2$.

Dielectric layer 1104 may be formed by any suitable method such as, but not limited to, atomic layer deposition (ALD), chemical vapor deposition (CVD), or plasma enhanced chemical vapor deposition (PECVD).

In some embodiments, prior to forming the dielectric layer 1104 on a surface of the semiconductor structure 1100, a conductive rutile oxide layer 1145 may be formed. In some embodiments, the conductive rutile oxide layer 1145 is formed on a surface within the semiconductor structure 1100, such as etch stop 1103, and the dielectric layer 1104 is formed thereafter as shown in FIG. 11A.

Dielectric layer 1104, such as a $TiO_2$ dielectric layer 1104, can be uniformly formed using a CVD method or an ALD method. In some embodiments, $TiO_2$ dielectric layer 1104 may be formed by an ALD method which is described above.

Figure 11B:
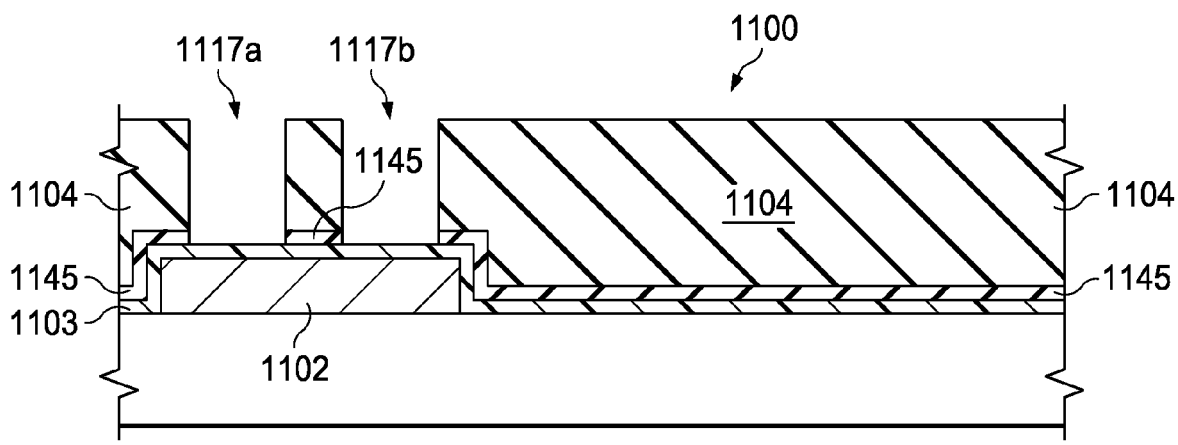

Next, steps 1202, 1203 provide forming a first trench 1117a and a second trench 1117b within the dielectric layer 1104 and the conductive rutile oxide layer 1145 wherein the first and second trenches 1117a, 1117b have at least one curved portion (see reference numbers 919a, 919b in FIG. 9), as illustrated in FIG. 11B.

In addition, portions of dielectric layer 1104 and conductive rutile oxide layer 1145 are selectively etched using a photoresist pattern to form a plurality of trenches 1117a, 1117b exposing the etch stop 1103. As shown, trenches 1117a, 1117b are disposed within the semiconductor structure 1100.

To form trenches 1117a, 1117b that have parallel wave-shaped trench patterns, a reactive-ion-etching (RIE) technique may be utilized. In some embodiments, a $SF_6/CF_4$ RIE silicon etch chemistry and mask is used to define the area to be etched in dielectric layer 1104 and conductive rutile oxide layer 1145 thereby forming parallel wave-shaped trench patterns. In some embodiments, the first and second trenches 1117a, 1117b are formed simultaneously within the dielectric layer 1104. Alternatively, the first and second trenches 1117a, 1117b are formed in sequence.

The depth of each trench 1117a, 1117b may extend to a depth less than or equal to 100 nm. The distance between each trench 1117a, 1117b, particularly each electrode 1118a, 1118b, may be in the range from 3-20 nm. In some embodiments, the distance between each electrode 1118a, 1118b is approximately five (5) nm.

Figure 11C:
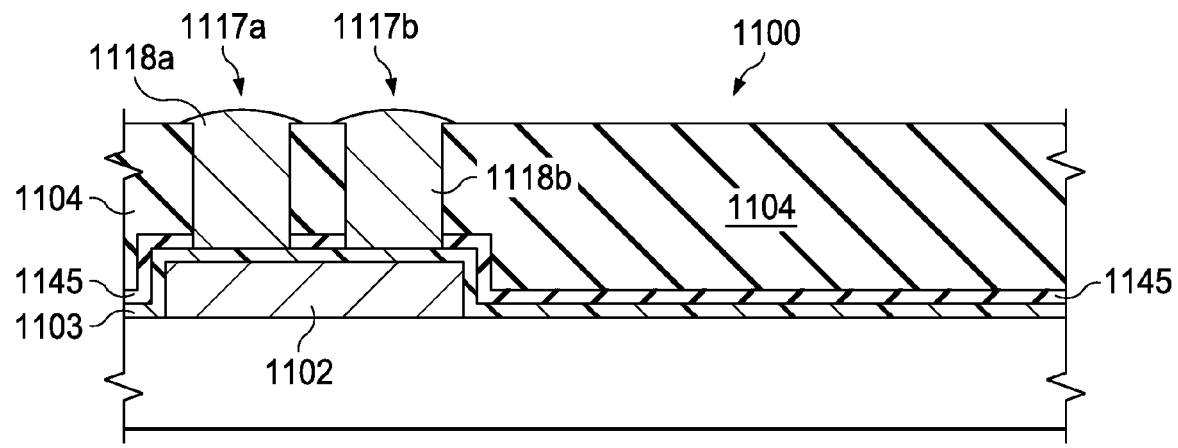

Next, according to step 1204, forming a second material 1118a within trench 1117a and third material 1118b within trench 1117b as shown in FIG. 11C. The second and third material 1118a, 1118b may comprise any of W, Ni, TaN, Pt, WN, Ti, TiN, TiAlN, Ru, or Ir. Most importantly, the second and third materials function as electrodes of a capacitive device. In some embodiments, the second and third materials are different. For example, it may be desirable in some applications for second and third materials 1118a, 1118b to be different such that the electrodes have different work functions.

Figure 11D:
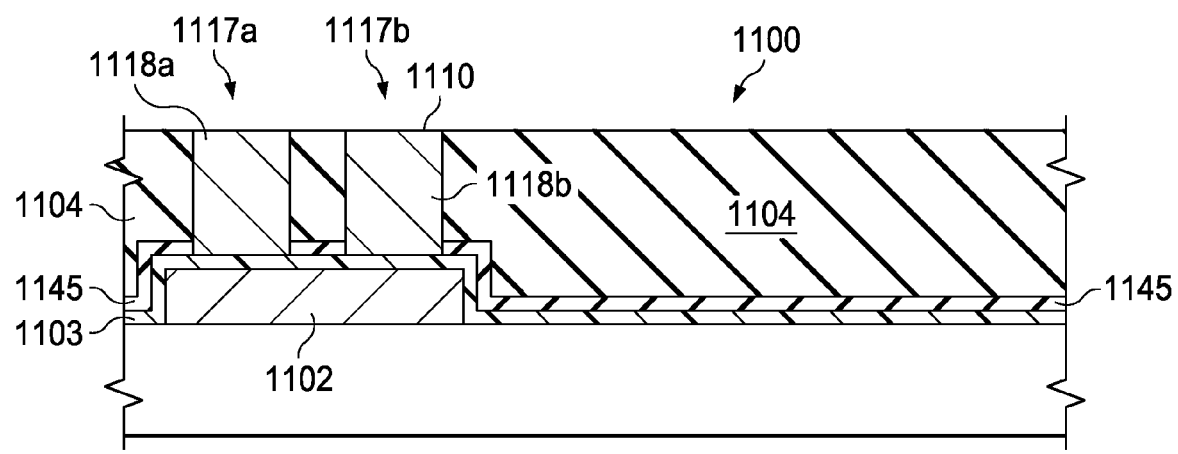

Finally, method 1200 concludes with step 1205, applying a planarization process to a top surface 1110 of the second and third materials 1118a, 1118b formed within the trenches 1117a, 1117b as shown in FIG. 11D. In some embodiments, a chemical mechanical planarization (CMP) process is utilized to planarize the top surface of the second and third materials 1118a, 1118b.

Multiple capacitive devices, consistent with the present disclosure, can be formed by creating a plurality of adjacent trenches (i.e. more than two trenches) within a single dielectric layer. The adjacent trenches in the plurality may have substantially concentric curved portions whereas some of the adjacent trenches may have curved portions with substantially separated centers of curvature. Notably, each capacitive device can operate independently.

In some embodiments, some of the capacitive devices formed within a single dielectric layer can be electrically interconnected such that they operate as a single capacitive device. The aforementioned configuration may be advantageous to decrease parasitic coupling to other devices.

For example, a pair of capacitive devices each similar to those illustrated in FIGS. 9-11 can be formed within a single dielectric layer such that each capacitive device has one electrode substantially adjacent only to the other capacitive device in the pair while the other electrode can be adjacent to any other device (e.g. external devices).

The capacitive devices in the pair can be electrically connected such that the adjacent electrodes are connected a line operating as a signal line. For example, the adjacent electrodes may be connected to a line that can change the electrical properties during operation while the electrodes adjacent to any external devices are maintained at a constant electrical potential (e.g. grounded).

As such, because the electrodes seen by the external devices are kept at a constant electrical potential, the perturbation to the performance of the external devices can be minimized. One having ordinary skill in the art can appreciate that in this configuration the two adjacent electrically connected electrodes do not need to be formed in separate trenches. In fact, the two capacitive devices in the pair can use the opposite surfaces of one common electrode, formed within a first trench, while the grounded electrodes can be spatially separated. For example, the grounded electrodes can be formed within a second and third trench, respectively, wherein the first trench is disposed between the second and third trenches.

Methods and apparatuses for forming a capacitive device have been described. It will be understood that the descriptions of some embodiments of the present disclosure do not limit the various alternative, modified and equivalent embodiments which may be included within the spirit and scope of the present disclosure as defined by the appended claims. Furthermore, some embodiments of the present disclosure may be practiced without these specific details. In other instances, well known methods, procedures, and components have not been described in detail so as not to unnecessarily obscure aspects of the present embodiments.

What is claimed is:

1. A method for forming a capacitive device, the method comprising:
    forming a dielectric layer above a substrate, wherein the dielectric layer comprises a first material;
    wherein a preferred crystal direction for the dielectric constant of the first material is parallel to a surface of the dielectric layer;
    forming a first trench within the dielectric layer wherein the first trench has at least one curved portion;
    forming a second trench within the dielectric layer wherein the second trench has at least one curved portion, wherein the second trench is formed around a perimeter of the first trench;
    forming a second material within the first trench and a third material within the second trench, wherein each of the second material and the third material are conductive;
    wherein the first material is different from the second material and the third material; and
    wherein the first trench and the second trench are separated by a distance between 3-20 nm.

2. The method of claim 1, wherein the first trench and second trench are formed by a RIE process technique.

3. The method of claim 1, wherein the first trench and the second trench are formed in a concentric shape.

4. The method of claim 1, wherein the first trench and the second trench are formed simultaneously.

5. The method of claim 1, wherein the first and second trenches are formed sequentially.

6. The method of claim 1 further comprising forming a conductive rutile oxide layer within a semiconductor structure prior to forming the dielectric layer such that the dielectric layer is formed on the conductive rutile oxide layer.

7. The method of claim 1, wherein the first trench and the second trench are formed in at least one of a circular or a wave-like shape.

8. The method of claim 1, wherein a degree of curvature of the curved portions of the first trench and the second trench are different.

9. A capacitive device comprising:
    a dielectric layer formed above a substrate wherein the dielectric layer comprises a first material;
    wherein a preferred crystal direction for the dielectric constant of the first material is parallel to a surface of the dielectric layer;
    a first trench formed within the dielectric layer wherein the first trench has at least one curved portion;
    a second trench formed within the dielectric layer wherein the second trench has at least one curved portion, wherein the second trench is disposed around a perimeter of the first trench, and wherein a ratio of a first distance from a common center point of the first trench and the second trench to an outside wall of the first trench and a second distance from the common center point to an inside wall of the second trench is in the range from 0.9 to 0.99;
    a second material formed within the first trench and a third material formed within the second trench, wherein each of the second material and the third material are conductive;
    wherein the first material is different from the second material and the third material; and
    wherein the first trench and the second trench are separated by a distance between 3-20 nm.

10. The capacitive device of claim 9, wherein the first material comprises at least one of $TiO_2$ or $GeO_2$.

11. The capacitive device of claim 10, wherein the first material comprises $TiO_2$ and wherein the first material has a rutile crystal structure.

12. The capacitive device of claim 9, wherein the first material is anisotropic.

13. The capacitive device of claim 9, wherein a depth of each first trench and second trench is approximately 50 nm.

14. The capacitive device of claim 9, wherein the second material and the third material each comprise at least one of W, Ni, TaN, Pt, WN, Ti, TiN, TiAlN, Ru, or Ir.

15. The capacitive device of claim 9, wherein a $RuO_2$ layer is disposed beneath the dielectric layer.

16. The capacitive device of claim 9, wherein the second material and the third material are different.

* * * * *